United States Patent [19]

Botez

[11] Patent Number: 4,523,316
[45] Date of Patent: Jun. 11, 1985

[54] SEMICONDUCTOR LASER WITH NON-ABSORBING MIRROR FACET

[75] Inventor: Dan Botez, Mount Holly, N.J.

[73] Assignee: RCA Corporation, Princeton, N.J.

[21] Appl. No.: 437,838

[22] Filed: Oct. 29, 1982

[51] Int. Cl.³ .............................................. H01S 3/19
[52] U.S. Cl. ...................................... 372/45; 357/17; 372/48
[58] Field of Search ............... 372/44, 45, 46, 48, 372/50; 357/17, 55, 56

[56] References Cited

U.S. PATENT DOCUMENTS

| | | | |
|---|---|---|---|
| 3,701,047 | 10/1972 | Caplan et al. | 372/49 |
| 3,753,801 | 8/1973 | Lockwood et al. | 148/171 |
| 3,978,426 | 8/1976 | Logan et al. | 372/45 |
| 3,993,963 | 11/1976 | Logan et al. | 372/45 |
| 4,092,659 | 5/1978 | Ettenberg | 372/49 |
| 4,178,564 | 12/1979 | Ladany et al. | 372/49 |
| 4,215,319 | 7/1980 | Botez | 372/46 |
| 4,297,652 | 10/1981 | Hayashi et al. | 372/50 |
| 4,347,486 | 8/1982 | Botez | 372/46 |
| 4,383,320 | 5/1983 | Botez et al. | 372/45 |

FOREIGN PATENT DOCUMENTS 1530801 11/1978 United Kingdom .
2109156 5/1983 United Kingdom .

OTHER PUBLICATIONS

Ueno, "Optimum Design Conditions for AlGaAs Window Stripe Lasers" IEEE Journal of Quantum Electronics QE17, 2113 (1981).
Botez "InGaAsP/InP Double Heterostructure Lasers" IEEE Journal of Quantum Electronics, QE17, 178 (1981).
Botez, et al., "Single-Mode Positive-Index Guided cw Constricted Double-Heterojunction Large-Optical-Cavity AlGaAs Lasers with Low Threshold-Current Temperature Sensitivity", Appl. Phys. Lett. 38(9), May 1981, pp. 658-660.
Botez, "cw High-Power Single-Mode Operation of Constricted Double-Heterojunction AlGaAs Lasers with a Large Optical Cavity", Appl. Phys. Lett. 36(3), Feb. 1980, pp. 190-192.

Primary Examiner—James W. Davie
Attorney, Agent, or Firm—Birgit E. Morris; Donald S. Cohen; William J. Burke

[57] ABSTRACT

A constricted heterostructure laser in which the active layer does not extend to an emitting facet. The light from the active layer is coupled into an underlying guide layer which provides lateral guidance of the laser beam to the emitting facet. The shape of the output laser beam in both the lateral and transverse directions may be varied by varying the shape of the guide layer in that portion of the laser where the active layer does not overlie the guide layer.

9 Claims, 7 Drawing Figures

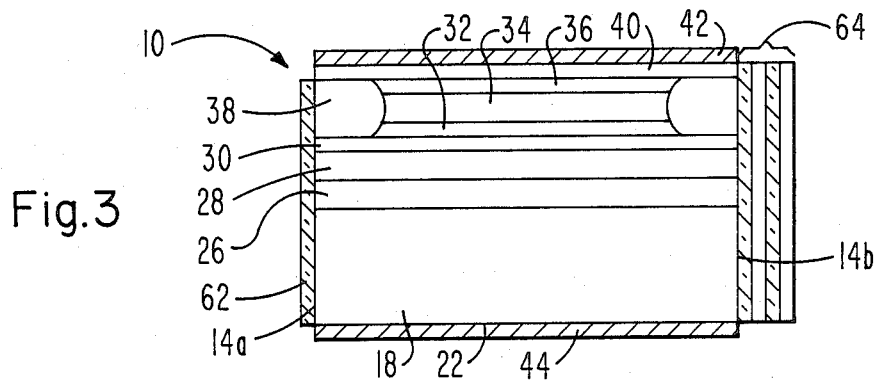
Fig. 3
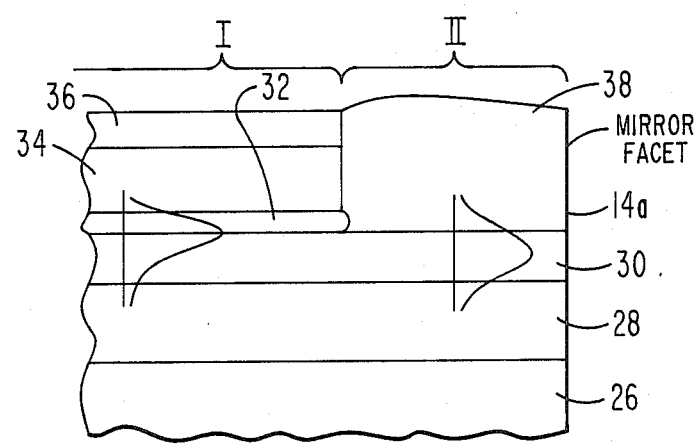
Fig. 4
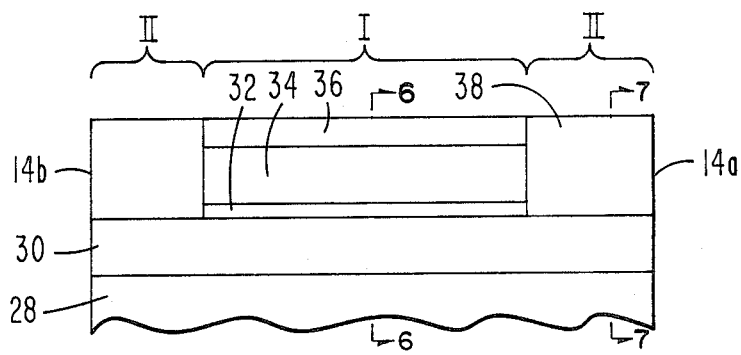
Fig. 5
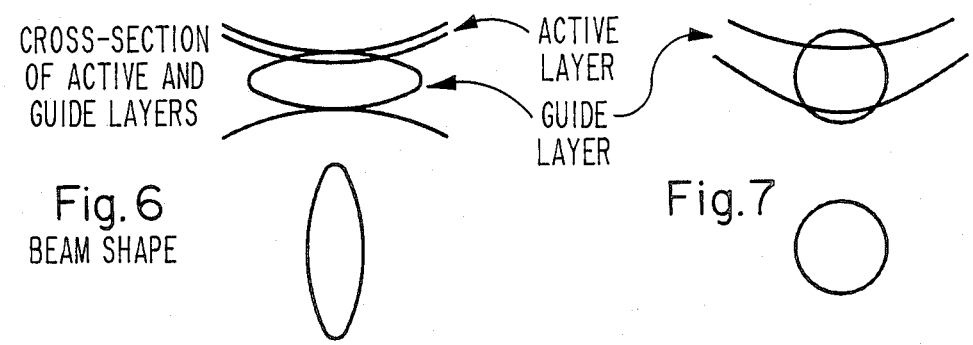
Fig. 6
BEAM SHAPE
Fig. 7

SEMICONDUCTOR LASER WITH NON-ABSORBING MIRROR FACET

The U.S. Government has rights in this invention pursuant to a Government Contract.

The invention relates to a semiconductor laser and, in particular, to a laser having a non-absorbing region adjacent to a mirror facet.

BACKGROUND OF THE INVENTION

A semiconductor laser typically comprises a body of material, generally group III-V compounds or alloys of such compounds, having a thin active layer between layers of opposite conductivity type. Constricted double heterostructure lasers, such as those disclosed by Botez in U.S. Pat. No. 4,347,486 and by Connolly et al. in U.S. Pat. No. 4,461,008 and entitled, TERRACED HETEROSTRUCTURE SEMICONDUCTOR LASER which are incorporated herein by reference, are capable of producing a single transverse (the direction perpendicular to the plane of the layers) and lateral (the direction in the plane of the layers and perpendicular to the direction of light propagation) mode, high power laser beam. These lasers have a guide layer adjacent to the active layer so that light generated in the active layer propagates mostly in the adjacent guide layer, thereby producing a much larger facet area from which light is emitted. The emission from one of the mirror facets of such a laser still occurs only over a small portion, typically in the order of several square micrometers ($\mu$m), of a mirror facet of the device. The local power density is thus very high and may result in damage to the emitting mirror laser facet which can be either a slow, long term facet erosion or oxidation or it can be catastrophic in nature. To avoid either type of damage the laser output power density at the facet is held below the threshold at which such damage occurs. In addition a transparent coating, such as that disclosed by Ladany et al. in U.S. Pat. No. 4,178,564, incorporated herein by reference, may be placed on the emitting facet to increase the threshold at which the damage occurs. This combination of measures reduces the incidence of laser facet damage but the laser's inherent output power capability is still far from being fully used.

It has been suggested that catastrophic facet damage is caused by local heating of the mirror facet to a temperature close to the melting temperature of the material by absorption of the laser light. To reduce or eliminate this effect, semiconductor lasers have been fabricated in which the light absorbing active layer of the device does not extend to the facet. The region between the ends of the active layer and the facets is formed of a light transmissive material thereby eliminating the problem of light absorption at the facets. Such devices have shown an increase in the threshold powers at which the long term and catastrophic damage occur of between about five and ten times.

Such devices do not, however, provide lateral mode control particularly in the transparent regions adjacent to the mirror facets. Thus, the lateral mode character of the output light beam will depend upon the length of the transparent regions which will differ from device to device because of the inaccuracy present in the cleaving process used to form the facets.

Thus, it would be desirable to have a semiconductor laser having lateral mode control extending to a non-absorbing facet.

SUMMARY OF THE INVENTION

The invention is a semiconductor laser comprising a body having a pair of parallel mirror facets and including a substrate with a pair of substantially parallel channels in a surface thereof. A first confinement layer overlies the surface of the substrate and the channels, and a guide layer which tapers in thickness in the lateral direction overlies the first confinement layer. An active layer overlies a portion of the guide layer and extends towards but does not contact the facet from which light is emitted. A second confinement layer overlies the active layer and a confinement region overlies the guide layer where the active layer is not present. This device will have both lateral and transverse mode control extending to the facet. The shape of the guide layer may be varied in both the lateral and transverse directions to change the shape of the mode at the emitting facet.

BRIEF DESCRIPTION OF THE DRAWING

FIG. 3 is a side view of the semiconductor laser of FIG. 1 with facet coatings thereon.

FIG. 4 is a schematic illustration of the laser beam intensity distribution in the semiconductor laser of the invention.

FIG. 5 is a schematic illustration of a side view of the laser structure delineating the first and second regions.

FIG. 6 is a schematic illustration of a cross-sectional view along the line 6—6 of FIG. 5.

FIG. 7 is a schematic illustration of a cross-sectional view of FIG. 5 along the line 7—7 showing the taper of the guide layer in the second region.

DETAILED DESCRIPTION OF PREFERRED EMBODIMENTS

Figure 1:
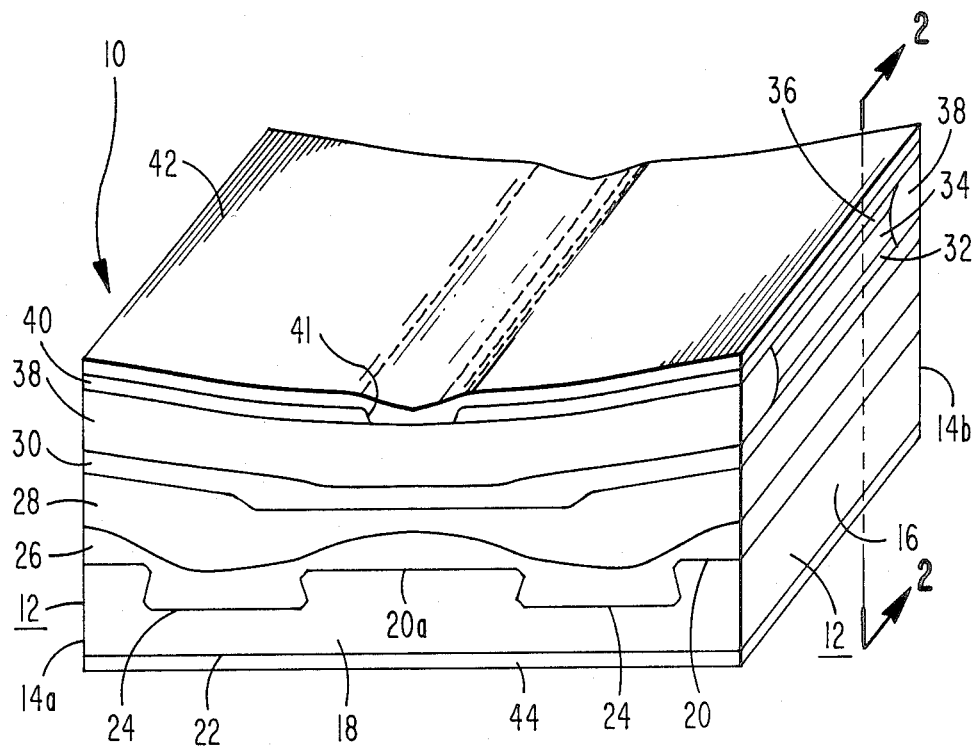
FIG. 1 is a perspective view of a semiconductor laser of the invention.

The semiconductor laser 10 of FIG. 1 comprises a body 12 of single crystal semiconductor material in the form of a parallelopiped. The body 12 has spaced, parallel mirror facets 14a and 14b which are reflecting of light with at least one of the facets being partially transparent so that light may be emitted therefrom. The body 12 also includes spaced, parallel side surfaces 16 which extend between and are perpendicular to the facets 14a and 14b.

The semiconductor body 12 includes a substrate 18 having spaced, parallel first and second major surfaces 20 and 22 respectively which extend between and are perpendicular to both the facet 14a and 14b and the side surfaces 16. In the major surface 20 of the substrate 18 are a pair of spaced, substantially parallel channels 24 which extend between the facets 14a and 14b. The portion of the major surface 20 between the channels 24 forms a mesa 20a. A buffer layer 26 overlies the major surface 20, the mesa 20a and partially fills the channels 24. A first confinement layer 28 overlies the buffer layer 26 and a guide layer 30 overlies the first confinement layer 28. An active layer 32 overlies a portion of the surface of the guide layer 30 extending between the sides surfaces 16 and toward, but not contacting, the facets 14a and 14b. A second confinement layer 34 overlies the active layer 32 and a capping layer 36 overlies the second confinement layer 34. A confinement region 38 overlies the guide layer 30 in those portions not overlaid by the active layer 32. An electrically insulating layer 40 overlies the capping layer 36 and the confinement region 38 and has an opening 41 extending therethrough. A first electrical contact 42 overlies the electrically insulating layer 40 and the capping layer 36 in the opening 41. A second electrical contact 44 overlies the surface 22 of the substrate 18. The electrical contacts 42 and 44 form the electrical contact means to the body 12.

In FIGS. 2-5, the identification of those elements which are common to these FIGURES and to FIG. 1 is the same.

Figure 2:
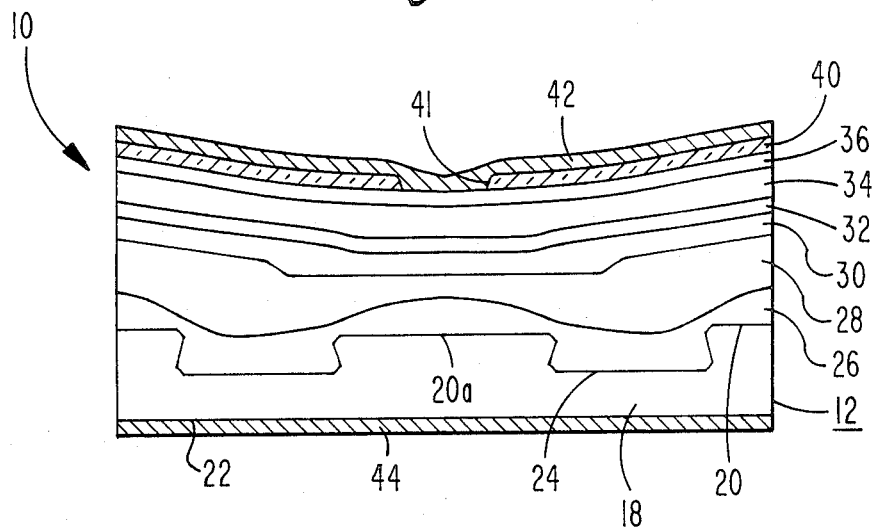
FIG. 2 is a cross-sectional view of the laser of FIG. 1 along the line 2—2.

In FIG. 2 a cross-section of the laser 10 along the line 2—2 of FIG. 1 is shown. The active layer 32, the second confinement layer 34 and the capping layer 36 are shown extending between the side surfaces 16.

The substrate 18, the buffer layer 26, the first confinement layer 28 and the guide layer 30 are of one conductivity type. The second confinement layer 34 and the capping layer 40 are of opposite conductivity type. The active layer 32 may be of either conductivity type and is typically only lightly conducting. The confinement region 38 may be of either conductivity type and typically has n-type conductivity. The high resistivity of the confinement region 38 serves to block the flow of electrical current around the active region 32. Alternatively, the confinement region 38 may be composed of two layers of opposite conductivity type with a p-n junction therebetween to restrict the current flow.

The refractive index at the laser wavelength of the active layer 32 is greater than that of the guide layer 30 which, in turn, is greater than that of the confinement layers 28 and 34 and the confinement region 38.

FIG. 3 is a side view of the laser 10 which includes a light transmissive coating 62 overlying the facet 14a through which laser light is emitted. Such a coating has been disclosed by Ladany et al. in U.S. Pat. No. 4,178,564. A light reflector 64 overlies the opposed facet 14b. Useful light reflectors include a metal as disclosed by Caplan et al. in U.S. Pat. No. 3,701,047 and a dielectric stack reflector as disclosed by Ettenberg in U.S. Pat. No. 4,092,659, both of which are incorporated herein by reference.

The various layers may be deposited sequentially on the substrate 18 using the well-known techniques of liquid phase epitaxy such as are described by Botez in U.S. Pat. No. 4,215,319 and by H. F. Lockwood et al. in U.S. Pat. No. 3,753,801, both of which are incorporated herein by reference. In liquid phase epitaxy the local growth rate of a layer varies with the local curvature of the surface on which it is grown. The greater the amount of local positive curvature of the surface, when viewed from the direction of the overlying layers, the higher the local growth rate will be. For example, the first confinement layer 28 may be grown to a thickness such that the surface of this layer, upon which the guide layer 30 is deposited, has a local depression over the mesa 20a. The guide layer 30 will then have a higher local growth rate over those portions of the first confinement layer 28 having the greatest positive curvature, that is, the convex portions of the depression. The top surface of the guide layer 30 will have a convex shape centered over the mesa 20a. The growth rate of the active layer 32 over the guide layer will be higher over the mesa 20a than over the channel 24, resulting in an active layer 32 which is thickest over the mesa 20a and tapers in decreasing thickness in the lateral direction. The net result is that the guide layer 30 tapers in increasing thickness in the lateral direction from that portion of the layer over the mesa 20a while the active layer tapers in decreasing thickness in the lateral direction.

The substrate 18 is typically composed of a binary III-V compound, preferably GaAs, having a major surface 20 which may be parallel to or, preferably, misoriented from a {100} crystallographic plane with the axis of the channels oriented parallel to a <110> crystallographic axis. Use of a member of the <110> family of crystallographic axes is preferred since the mirror facets 14a and 14b of the semiconductor body 12 are then cleavage planes. The misorientation may be along or at an angle to the axis of the channels. Preferably, the misorientation angle of the substrate surface with respect to the (001) plane is at an angle between about 5° and 45°, and optimally at about 35°. The tilt angle of the (001) plane from the major surface 20 is between about 0.2° and 1.5° and preferably about 1° as disclosed by Connolly et al. in a U.S. Patent application Ser. No. 437,840 entitled SEMICONDUCTOR LASER HAVING HIGH MANUFACTURING YIELD filed concurrently herewith incorporated herein by reference. Alternatively, the misorientation angle may be about 90° to the axis of the channels as disclosed by Connolly et al. in U.S. Pat. No. 4,461,008. This latter misorientation results in a guide layer having a terraced surface with the active layer tapering in thickness from that portion of the active layer over the terrace.

The channels 24 are shown in FIG. 1 as having a dove-tail shape which results from the channel axis being parallel to a <110> crystallographic direction. Alternatively, the channels 24 may have a different shape, for example, a U, Vee or a rectangular shape which results when a different crystallographic axis or different chemical etchants are used. The channels 24 are typically between about 4 and 20 micrometers ($\mu$m) wide at the surface 20, preferably about 10 $\mu$m wide, and have a depth of about 4 $\mu$m. The center-to-center spacing between the channels 24 is typically between about 20 and 45 $\mu$m and is preferably about 32 $\mu$m. The channels 24 are formed using standard photolithographic and etching techniques as disclosed by Botez in U.S. Pat. No. 4,215,319.

The height of the surface of the mesa 20a may be different from the height of the major surface 20 above the bottom of the channels 24 as disclosed by Botez in U.S. Pat. No. 4,426,701, incorporated herein by reference. This difference in height produces a greater curvature of the layers deposited thereon than is the case where the mesa and the surrounding surface have the same height. This difference in height is typically between about 0.5 and 3 $\mu$m and preferably between about 1 and 2 $\mu$m.

The buffer layer 26 is typically composed of the same material as the substrate 18 and is typically between about 1 and 3 $\mu$m thick over the mesa 20a. The thickness of this layer varies in the lateral direction due to the non-uniform growth rate over the underlying channels 24 and is asymmetrical if the substrate surface is misoriented from a {100} plane in a direction which is nonparallel to the axis of the channels.

The first confinement layer 28 is typically composed of $Al_wGa_{1-w}Al$ where the fractional concentration w of Al is between about 0.25 and about 0.4 and is typically about 0.35. This layer is typically between about 1 and 3 $\mu$m thick over the mesa 20a and varies asymmetrically in thickness in the lateral direction.

The guide layer 30 is typically composed $Al_xGa_{1-x}As$ where the fractional concentration x of Al is less than that of the first confinement layer 28 and greater than that in the active layer 32 and is typically between about 0.1 and 0.3 but preferably about 0.2. The guide layer 30 typically tapers in increasing thickness from the portion thereof over the mesa 20a and has a thickness over the mesa 20a between about 0.5 and about 3 μm.

The active layer 32 is typically composed of $Al_yGa_{1-y}As$ where the fractional concentration y of Al is less than the concentration in the guide layer 30 and is typically between about 0 and about 0.07. This layer is typically between about 0.05 and 0.2 μm thick over the mesa 20a and tapers in decreasing thickness in the lateral direction. The active layer 32 typically extends a distance of between about 100 and 200 μm between the mirror facets 14a and 14b and may extend to within between about 10 and 100 μm, and typically to within about 50 μm, of the facets.

The second confinement layer 34 is typically composed of $Al_zGa_{1-z}As$ where the fractional concentration z of Al is between about 0.3 and about 0.5 and preferably is about 0.4. The second confinement layer 34 is typically between about 1 and 3 μm thick over the mesa 20a.

The capping layer 36 is typically between about 0.1 and 0.5 μm thick and is composed of GaAs.

The confinement region 38 is typically composed of $Al_mGa_{1-m}As$ where the fractional concentration m of Al is between about 0.2 and 0.4 and is typically about 0.3. The thickness of the confinement region 38 is preferably about equal to the thickness of the combination of the active layer 32, the second confinement layer 34 and the capping layer 36 so as to provide an approximately planar surface for this combination of layers and the confinement region 38.

In the fabrication of the laser of the invention, the active layer, the second confinement layer and the capping layer are sequentially deposited over the entire surface of the guide layer using liquid phase epitaxy. Portions of the capping layer, second confinement and active layers adjacent one or both of the facets are then removed by a sequence of selective chemical etching steps. Selective etching steps are preferred since the layers are non-planar due to the channelled substrate. The capping layer 36, if composed of GaAs, may be removed using an etchant such as: 1 $H_2SO_4$:8 $H_2O_2$:8 $H_2O$ or 20 $H_2O_2$:1 $NH_4OH$ at 20° C.for about 15 seconds. The second confinement layer 34, if composed of p-type AlGaAs, may be removed using as an etchant either 1 HF:1 $H_2O$ or 1 HCl:1 $H_2O$. The active layer 32, if composed of GaAs or $Al_qGa_{1-q}As$ where q is less than about 0.07, may be removed using as an etchant 20 $H_2O_2$:1 $NH_4OH$. The relative concentrations in these chemical formulae are concentrations by volume. If the concentration q of Al in the active layer is kept less than about 0.07, then the etchant used to remove this layer would remove little if any of the underlying guide layer 30. Alternatively the active layer 32 may be removed by melt etching.

After the etching process is completed, a mask is deposited on the capping layer 36 and the confinement region 38 is grown using standard liquid phase epitaxy techniques. Alternatively the confinement region 38 may be deposited by vapor phase or molecular beam epitaxy. After the deposition process is complete, the masking layer overlying the capping layer 36 is removed and the electrically insulating layer 40 is deposited onto the capping layer and the confinement region 38.

The electrically insulating layer 40 is preferably composed of silicon dioxide which is deposited on the capping layer 36 and the confinement region 38 by pyrolytic decomposition of a silicon-containing gas, such as silane, in oxygen or water vapor.

The opening 41 is formed extending through the electrically insulating layer 40 down to the capping layer 36 over the mesa 20a between the channels using standard photolithographic masking techniques and etching processes. The opening 41 need only extend over the capping layer.

The electrical contact 42, preferably composed of titanium, platinum and gold, is then deposited by sequential vacuum evaporation over the electrically insulating layer 40 and the capping layer 36. The electrical contact 44 on the second major surface 22 of the substrate 18 may be formed by vacuum deposition and sintering of tin and gold.

Alternatively, the functions of the capping layer 36 and the electrically insulating layer 40 may be combined in a blocking layer of a semiconductor material, such as GaAs, having the opposite conductivity type to that of the second confinement layer 34. A portion of the blocking layer, typically in the form of a stripe, over the thickest portion of the active layer contains an excess concentration of a second conductivity modifier which changes the conductivity type of the stripe portion to that of the second confinement layer 34. Application of a forward bias voltage between the electrical contacts will reverse bias the junction between the blocking layer and the second confinement layer thereby blocking current flow through the layer except in the region of the stripe.

Confinement of the propagating laser beam in the lateral direction with the device is produced by an effective transverse index of refraction variation arising from the thickness and composition of the different layers. In the laser of the invention there are two separate regions which must be considered since the structure changes: a first region, labelled I in FIGS. 4 and 5, where the active layer overlies the guide layer and a second region, labelled II in FIGS. 4 and 5, where the active layer is not present over the guide layer. There are two contributions to this variation in the refractive index, namely, the different bulk indices of refraction of the different layers and the variation in the effective index of refraction due to the varying thickness of the individual layers. In FIG. 4 the transverse spatial power variation in the first and second regions is schematically illustrated. In the first region I the beam is concentrated at or near the active layer 32 while in the second region II the beam is concentrated in the guide layer 30. To maximize the amount of power coupled from the first region I into the second region II it is preferable that the effective transverse propagation constants in the two regions be matched as closely as possible. This can be done by selecting the Al concentration in the confinement region 38 such that the transverse effective refractive index in the second region II must be about equal to that of the first region I; the transverse refractive index being a combination of the contributions of the layers in which the light beam propagates as disclosed, for example, by Botez in the *IEEE Journal of Quantum Electronics QE*-17, 78 (1981).

The output beam of the laser of the invention can be changed from an elliptical shape at the emitting facet to an approximately circular or other desired shape by changing the shape and taper of the guide layer in the second region. In particular the guide layer may taper in increasing thickness in the lateral direction in the first region and taper in decreasing thickness in the lateral direction in the second region. This can be done, for example, by varying the height of the mesa between the first and second regions. The height of the mesa above the bottom of the channels in the second region is less than the height of the mesa above the bottom of the channels in the first region. FIGS. 6 and 7 are schematic illustrations of the cross-sections of the laser structure in the first and second regions when the height of the mesa above the bottom of the channels in the first region is greater than that of the mesa in the second region. The shape of the guide layer 30 changes from a taper in increasing thickness in the first region to a taper in decreasing thickness of the second region. The beam thus guided in the second region will have shape more nearly circular than that in the first region.

I claim:

1. A semiconductor laser comprising:
   a body of material having a pair of opposed mirror facets which are reflective of light, at least one of which is partially transmissive of light, said body including:
   a substrate having first and second opposed surfaces with a pair of substantially parallel channels with a mesa therebetween, in said first surface and extending between said facets;
   a first confinement layer overlying said first surface and the surfaces of said channels and said mesa;
   a guide layer overlying said first confinement layer and tapering in thickness in the lateral direction;
   an active layer overlying a portion of the guide layer and extending towards but not contacting at least one of said facets, thereby forming a first region in the body where said active layer overlies the guide layer and a second region where said active layer does not overlie said guide layer;
   a second confinement layer overlying said active layer in said first region;
   a confinement region overlying said guide layer in said second region; and
   first and second electrical contacts overlying said second confinement layer and said second surface respectively;
   wherein the lateral tapers of the guide layer in the first and second regions are different; and
   wherein said active layer has a larger refractive index than said guide layer, said first and second confinement layers and said confinement region.

2. The laser of claim 1 wherein said active layer does not contact either of said facets.

3. The laser of claim 1 wherein a capping layer overlies said second confinement layer and an electrically insulating layer, having an opening therethrough, overlies said capping layer and said confinement region and said first electrical contact overlies said capping layer in said opening.

4. The laser of claim 3 wherein said substrate and said capping layer are composed of GaAs and said first and second confinement layers, said guide layer and said confinement region are composed of AlGaAs alloys.

5. The laser of claim 1 wherein the transverse effective refractive index in said first and second regions are about equal.

6. The laser of claim 1 wherein said guide layer tapers in increasing thickness from a portion thereof over said mesa.

7. The laser of claim 1 wherein said guide layer tapers in increasing thickness in the lateral direction in said first region and tapers in decreasing thickness in said second region.

8. The laser of claim 7 wherein the height of said mesa above the bottom of said channels is different in said first and second regions.

9. The laser of claim 8 wherein the height of said mesa above the bottom of the channels in said second region is less than the height of said mesa above the bottom of the channels in said first region.

* * * * *